US010607836B2

(12) United States Patent
Sandhu

(10) Patent No.: US 10,607,836 B2
(45) Date of Patent: Mar. 31, 2020

(54) METHODS OF FORMING STRUCTURES

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/178,760

(22) Filed: Nov. 2, 2018

(65) Prior Publication Data

US 2019/0074183 A1 Mar. 7, 2019

Related U.S. Application Data

(60) Continuation of application No. 15/889,598, filed on Feb. 6, 2018, now Pat. No. 10,121,662, which is a
(Continued)

(51) Int. Cl.
H01L 21/40 (2006.01)
G01N 15/06 (2006.01)
G01N 33/00 (2006.01)
G01N 33/48 (2006.01)
H01L 21/033 (2006.01)
H01L 21/308 (2006.01)
(Continued)

(52) U.S. Cl.
CPC ...... H01L 21/0338 (2013.01); B81C 1/00031 (2013.01); H01L 21/0332 (2013.01); H01L 21/0335 (2013.01); H01L 21/0337 (2013.01); H01L 21/3081 (2013.01); H01L 21/3086 (2013.01); H01L 21/76868 (2013.01); B81C 2201/0149 (2013.01); H01L 2221/1094 (2013.01); H01L 2924/0002 (2013.01)

(58) Field of Classification Search
CPC ............. H01L 21/0338; H01L 21/3081; H01L 21/3086; H01L 23/564
USPC ........................................... 438/99; 257/68.1
See application file for complete search history.

(56) References Cited

U.S. PATENT DOCUMENTS 6,946,675 B2 9/2005 Braun et al.
7,060,224 B2 6/2006 Edman et al.
(Continued)

FOREIGN PATENT DOCUMENTS

EP 0943158 A2 9/1999

OTHER PUBLICATIONS

IBM Scientists use Self-Assembled DNA Scaffolding to Build Tiny Circuit Boards, http://www-03.ibm.com/press/us/en/pressrelease/28185.wss, Aug. 17, 2009, 1 page.
(Continued)

Primary Examiner — David S Blum
(74) Attorney, Agent, or Firm — TraskBritt

(57) ABSTRACT

A method of forming a structure comprises forming a pattern of self-assembled nucleic acids over a material. The pattern of self-assembled nucleic acids is exposed to at least one repair enzyme to repair defects in the pattern. The repaired pattern of self-assembled nucleic acids is transferred to the material to form features therein. A method of decreasing defect density in self-assembled nucleic acids is also disclosed. Self-assembled nucleic acids exhibiting an initial defect density are formed over at least a portion of a material and the self-assembled nucleic acids are exposed to at least one repair enzyme to repair defects in the self-assembled nucleic acids. Additional methods are also disclosed.

21 Claims, 3 Drawing Sheets
Specification includes a Sequence Listing.

Related U.S. Application Data continuation of application No. 15/606,601, filed on May 26, 2017, now Pat. No. 9,911,609, which is a continuation of application No. 14/997,108, filed on Jan. 15, 2016, now abandoned, which is a division of application No. 14/151,635, filed on Jan. 9, 2014, now Pat. No. 9,275,871.

(51) Int. Cl.
*B81C 1/00* (2006.01)
*H01L 21/768* (2006.01)

(56) References Cited

U.S. PATENT DOCUMENTS

| | | |
|---|---|---|
| 7,977,177 B2 | 7/2011 | Roh et al. |
| 2007/0117109 A1 | 5/2007 | Rothemund |
| 2012/0135158 A1 | 5/2012 | Freer et al. |
| 2014/0061798 A1 | 3/2014 | Vinet et al. |
| 2014/0151759 A1 | 6/2014 | Loubet et al. |
| 2014/0220655 A1 | 8/2014 | Sun et al. |
| 2015/0194316 A1 | 7/2015 | Sandhu |
| 2016/0155660 A1 | 6/2016 | Rananavare et al. |
| 2016/0172195 A1 | 6/2016 | Sandhu |
| 2017/0263456 A1 | 9/2017 | Sandhu |

OTHER PUBLICATIONS

Dillow, Clay, IBM Scientists Harness DNA Self-Assembly to Build Faster, Cheaper Chips, Popular Science, http://www.popsci.com/scitech/article/2009-08/ibm-scientists-harness-dna-- self-assembly-build-faster-cheaper-chips, Aug. 18, 2009, 7 pages.

Caltech and IBM Scientists use Self-Assembled DNA Scaffolding to Build Tiny Circuit Boards, http://www.caltech.edu/content/caltech-and-ibm-scientists-use-self-assemb-led-dna-scaffolding-build-tiny-circuit-boards, Aug. 17, 20093 pages.

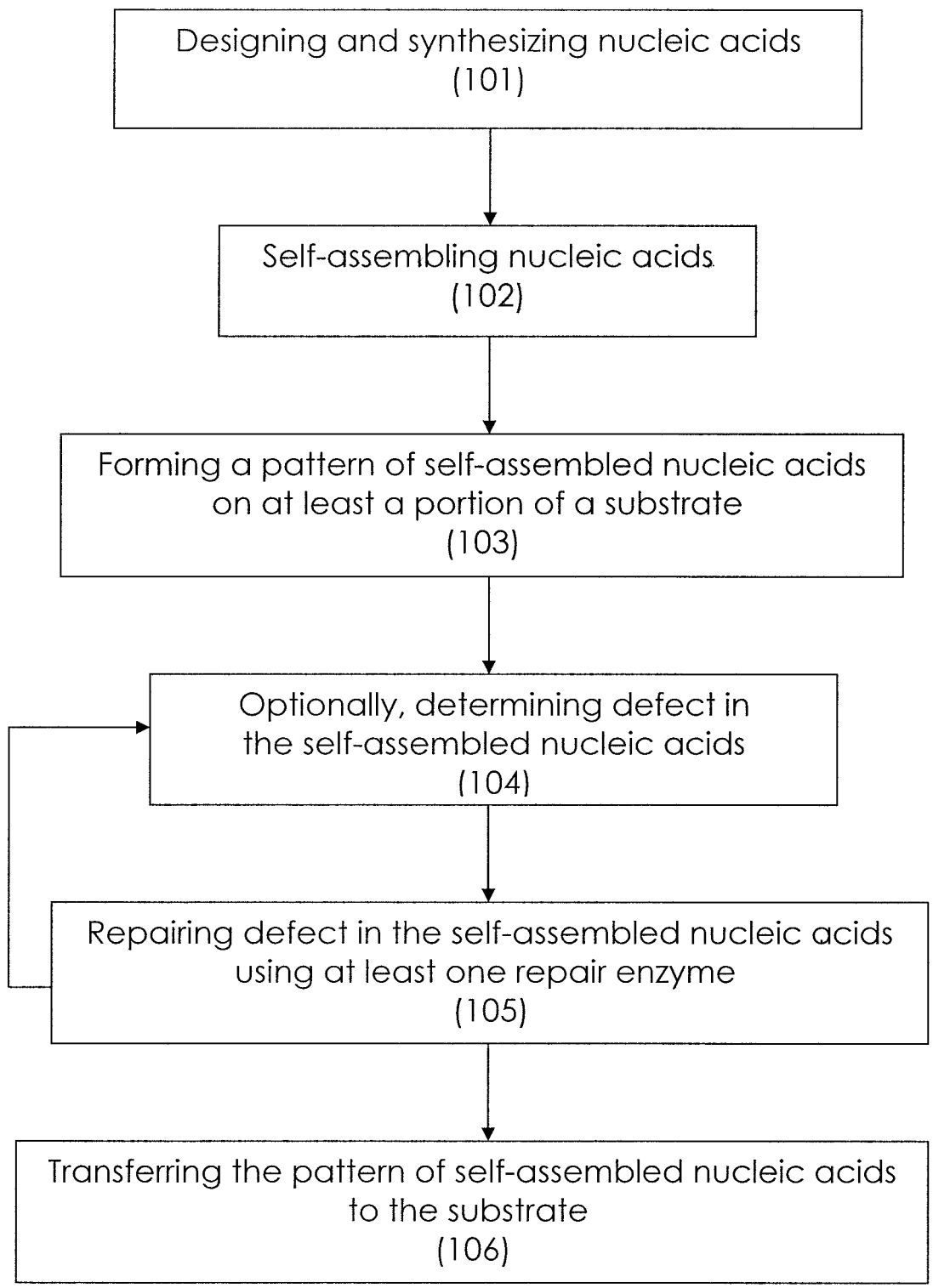

METHODS OF FORMING STRUCTURES

CROSS-REFERENCE TO RELATED APPLICATIONS

This application is a continuation of U.S. patent application Ser. No. 15/889,598, filed Feb. 6, 2018, now U.S. Pat. No. 10,121,662, issued Nov. 6, 2018, which is a continuation of U.S. patent application Ser. No. 15/606,601, filed May 26, 2017, now U.S. Pat. No. 9,911,609, issued Mar. 6, 2018, which is a continuation of U.S. patent application Ser. No. 14/997,108, filed Jan. 15, 2016, abandoned, which is a divisional of U.S. patent application Ser. No. 14/151,635, filed Jan. 9, 2014, now U.S. Pat. No. 9,275,871, issued Mar. 1, 2016, the disclosure of each of which is hereby incorporated herein in its entirety by this reference.

FIELD

The present disclosure, in various embodiments, relates generally to nanostructures comprising self-assembled nucleic acids and exhibiting low defect density, and to methods of preparing such nanostructures.

BACKGROUND

A continuing goal of integrated circuit fabrication is to decrease the dimensions thereof. Integrated circuit dimensions can be decreased by reducing the dimensions and spacing of the constituent features or structures. For example, by decreasing the dimensions and spacing of semiconductor features (e.g., storage capacitors, access transistors, access lines) of a memory device, the overall dimensions of the memory device may be decreased while maintaining or increasing the storage capacity of the memory device.

As the dimensions and spacing of semiconductor device features become smaller, conventional lithographic processes become increasingly more difficult and expensive to conduct. Therefore, significant challenges are encountered in the fabrication of nanostructures, particularly structures having a feature dimension (e.g., critical dimension) less than a resolution limit of conventional photolithography techniques (currently about 50 nm). It is possible to fabricate semiconductor structures of such feature dimensions using a conventional lithographic process, such as shadow mask lithography and e-beam lithography. However, use of such processes is limited because the exposure tools are extremely expensive or extremely slow and, further, may not be amenable to formation of structures having dimensions of less than 50 nm.

The development of new processes, as well as materials useful in such processes, is of increasing importance to make the fabrication of small-scale devices easier, less expensive, and more versatile. One example of a method of fabricating small-scale devices that addresses some of the drawbacks of conventional lithographic techniques is self-assembled block copolymer lithography.

Although self-assembled block copolymer lithography is useful for fabrication of semiconductor structures having dimensions of less than 50 nm, there are still problems that must be addressed. Self-assembled block copolymer materials may not provide nanostructures exhibiting sufficiently low defect levels.

Self-assembled nucleic acids have been researched for forming semiconductor devices. The specificity of complementary base pairing in nucleic acids provides self-assembled nucleic acids that may be used for self-assembled nucleic acid lithography processes.

BRIEF DESCRIPTION OF THE DRAWINGS

FIG. 1 is a flowchart diagram showing a method of forming nanostructures in accordance with one embodiment of the present disclosure;

DETAILED DESCRIPTION

Figure 2A:
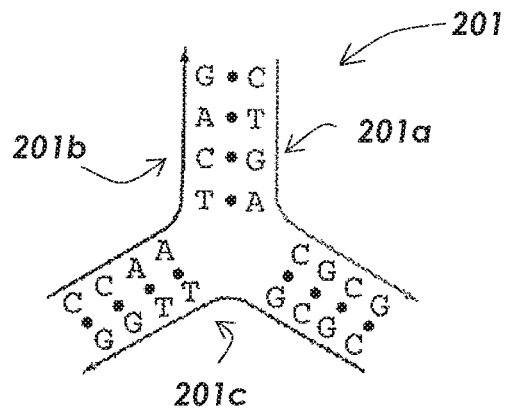
FIG. 2A shows self-assembled "multi-stranded" nucleic acids (SEQ ID NOS:1-3) according to one embodiment of the present disclosure.

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming nanostructures. Only those process acts and structures necessary to understand the embodiments of the present disclosure are described in detail below. Additional acts to form the complete nanostructures may be performed by conventional fabrication techniques. Also the drawings accompanying the application are for illustrative purposes only, and are thus not necessarily drawn to scale. Elements common between figures may retain the same numerical designation. Furthermore, while the materials described and illustrated herein may be formed as layers, the materials are not limited thereto and may be formed in other three-dimensional configurations.

As used herein, the singular forms "a," "an," and "the" are intended to include the plural forms as well, unless the context clearly indicates otherwise.

As used herein, the term "nucleic acid" means and includes a polymeric form of nucleotides (e.g., polynucleotides and oligonucleotides) of any length that comprises purine and pyrimidine bases, or chemically or biochemically modified purine and pyrimidine bases. Nucleic acids may comprise single stranded sequences, double stranded sequences, or portions of both double stranded or single stranded sequences. As non-limiting example, the nucleic acid may include ribonucleic acid (RNA), deoxyribonucleic acid (DNA), peptide nucleic acid (PNA), or combinations thereof. The backbone of the polynucleotide may comprise sugars and phosphate groups as may typically be found in RNA or DNA, or modified sugar and/or phosphate groups. Furthermore, the polynucleotide may comprise modified nucleotides, such as methylated nucleotides and nucleotide analogs.

As used herein, the term "substrate" means and includes a base material or a construction upon which additional materials are formed. Non-limiting example of the substrates may include glass, mica, polystyrene, polypropylene, polyamides, polyesters, polyacrylates, polyvinylchloride, polycarbonate, fluoropolymers, fluorinated ethylene propylene, polyvinylidene, polydimethylsiloxane, silicon, metals (e.g., gold, silver, titanium), and stainless steel.

In some embodiments, the substrate may be a semiconductor substrate, a base semiconductor material on a supporting structure, a metal electrode, or a semiconductor substrate having one or more materials, structures or regions formed thereon. By way of non-limiting example, the semiconductor substrate may be a conventional silicon substrate, or other bulk substrate comprising a layer of semiconductive material. As used herein, the term "bulk substrate" means and includes not only silicon wafers, but also silicon-on-insulator (SOI) substrates, silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process acts may have been conducted to form materials, regions, or junctions in or on the base semiconductor structure or foundation.

In one embodiment, a method of forming a nanostructure may comprise forming self-assembled nucleic acids on at least a portion of a substrate, and repairing defects in the self-assembled nucleic acids using at least one repair enzyme. As a non-limiting example, the method may include process acts as shown in flow diagram 100 of FIG. 1.

As shown in the FIG. 1, nucleic acids configured and formulated to form the predetermined self-assembled structures may be designed and synthesized (101). Upon dissolving the nucleic acids into a solution, nucleic acids may form the predetermined self-assembled structures through a complementary base pairing mechanism (102). Then, a pattern of self-assembled nucleic acids may be formed on at least a portion of a substrate (103). These self-assembled nucleic acids on the substrate may include at least one defect. Optionally, the defects and the density of defects may be determined (104) using any conventional techniques. The defects in the self-assembled nucleic acids may be repaired using at least one repair enzyme (105), to provide a nanostructure comprising self-assembled nucleic acids on at least a portion of the substrate exhibiting a reduced defect density. The repairing of defects (105) may be repeated as desired until a desired, reduced threshold level of defect density is achieved. Once the threshold level of defect density is achieved, the resulting pattern of the self-assembled nucleic acids may be transferred to the substrate (106).

A computer software program may be used to design and identify the nucleic acid sequences that are capable of self-assembling into the desired structures. The nucleic acids may be non-naturally occurring nucleic acids. The length and chemical makeup of the nucleic acid sequences may be selected depending on the desired self-assembled structures to be formed.

Any conventional techniques may be used to synthesize nucleic acids, and therefore such techniques are not described in detail herein. By way of non-limiting example, the nucleic acids may be synthesized using automated DNA synthesizer and phosphoramidite chemistry procedures.

Once synthesized, the nucleic acids may be dissolved into a solution. Upon dissolving in the solution, the nucleic acids may self-assemble into the desired self-assembled structures through a complementary base pairing mechanism. Various self-assembled nucleic acids may be used in the present disclosure.

In some embodiments, nucleic acids may self-assemble into a "multi-stranded" structure that is composed entirely of short oligonucleotide strands. For example, as shown in FIG. 2A, self-assembled nucleic acids 201 (SEQ ID NOS: 1-3) are composed of short oligonucleotide strands 201*a*, 201*b* and 201*c*.

In some embodiments, nucleic acids may self-assemble into a "scaffolded" structure. The self-assembled "scaffolded" structure is composed of a long single stranded polynucleotide ("scaffold strand") that is folded and bonded by a number of short strands of nucleic acids ("helper strands") into the desired structures. For example, as shown in FIG. 2B, self-assembled nucleic acids 202 (SEQ ID NOS:4-7) are composed of a scaffold strand 202*a* that is folded and fixed into a certain structure by the helper strands 202*b*, 202*b'*, and 202*b"*.

In some embodiments, nucleic acids may self-assemble into a "single-stranded" structure that is composed substantially of one long scaffold strand and few or no helper strands. For example, as shown in FIG. 2C, the self-assembled nucleic acid 203 (SEQ ID NO:8) is composed of one long scaffold strand 203*a*.

Figure 2B:
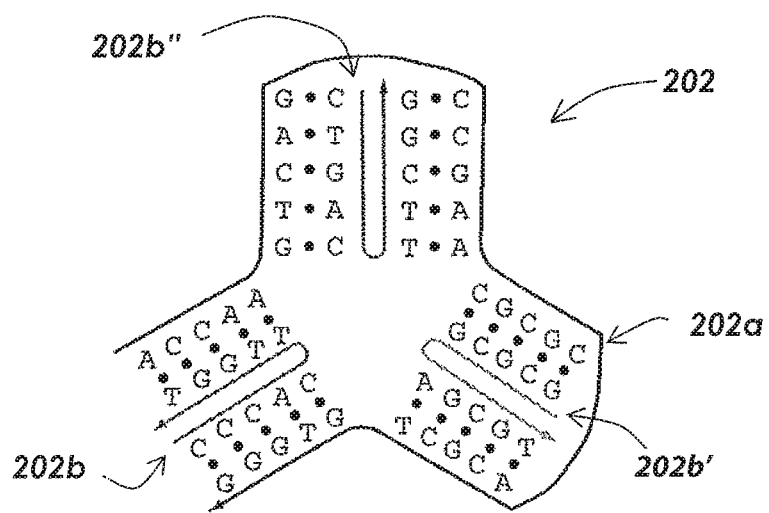
FIG. 2B shows self-assembled "scaffolded" nucleic acids (SEQ ID NOS:4-7) according to one embodiment of the present disclosure.
Figure 2C:
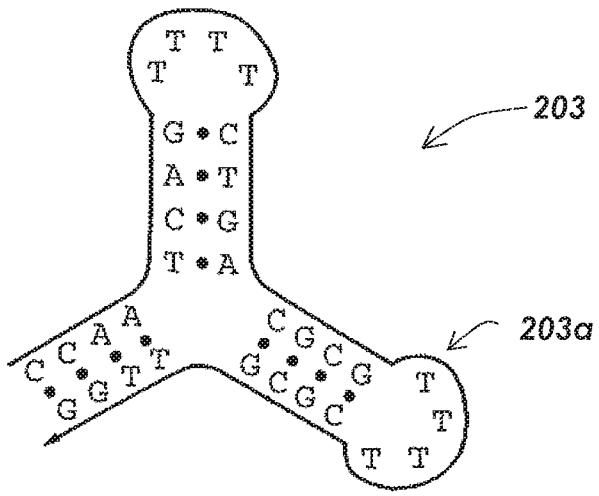
FIG. 2C shows self-assembled "single-stranded" nucleic acids (SEQ ID NO:8) according to one embodiment of the present disclosure.

It is understood that FIGS. 2A-2C show non-limiting example of the self-assembled nucleic acids, and that other self-assembled nucleic acids may be recognized by one skilled in the art.

The self-assembled nucleic acids may be formed on at least a portion of a substrate using any conventional techniques. In some embodiments, the self-assembled nucleic acids may be formed on a substantially entire exposed surface of a substrate. Then, portions of the self-assembled nucleic acids on the substrate may be selectively removed, leaving the self-assembled nucleic acids only on the desired portions of the substrate. By way of non-limiting example, the self-assembled nucleic acids on the substrate may be selectively removed using conventional mask techniques. In some embodiments, the self-assembled nucleic acids may be formed on the patterned regions of carbon on a silicon oxide background over a substrate.

In some embodiments, the self-assembled nucleic acids may be applied onto at least a portion of the substrate by contacting at least a portion of the substrate with a solution comprising the self-assembled nucleic acids. By way of non-limiting example, a solution comprising self-assembled nucleic acids may be applied to at least a portion of the substrate by spraying or coating techniques, or by dipping the substrate in a solution comprising self-assembled nucleic acids.

In some embodiments, the self-assembled nucleic acids may be formed on at least a portion of a substrate by covalently coupling the self-assembled nucleic acids to the substrate. The nucleic acids in the self-assembled nucleic acids may include a coupling functional group formulated and configured to form covalent bond with the substrate. By way of example only, when the substrate is gold, silver, silicon dioxide or aluminum metalized features, the coupling functional group on the nucleic acid may be a primary amine. When the substrate is metal, the coupling functional group on the nucleic acid may be an amine derivatized with a thiolation reagent such as succinimidyl 3-(2-pyridyldithio) propionate (SPDP). When the substrate is silicon dioxide, the coupling functional group on the nucleic acid may be dialdehyde derivatives of Schiff's base reaction. By way of a non-limiting example, when the substrate is glass or silicon dioxide ($SiO_2$), the substrate may be treated with dilute sodium hydroxide solution. Then, the substrate may be contacted with a solution of self-assembled nucleic acids that comprises 3-aminopropyltriethoxysilane (APS) group, to covalently couple the self-assembled nucleic acids to the substrate via the APS group.

In some embodiments, the self-assembled nucleic acids may be formed on at least a portion of substrate by ionic attraction using any conventional techniques. By way of a non-limiting example, magnesium ions ($Mg^{2+}$) may be added to an aqueous solution of self-assembled nucleic acids. The positive charge $Mg^{2+}$ attracts the negative charges on self-assembled nucleic acids, as well as the negative portions of the substrate. Thus, $Mg^{2+}$ ions function to adhere the self-assembled nucleic acids to the negative portions of the substrate.

In addition to forming the self-assembled nucleic acids on at least a portion of a substrate via covalent bonds or ionic attractions as described above, one of ordinary skill in the art recognizes that other known bonding techniques between the self-assembled nucleic acids and a substrate may be used.

In some embodiments, at least a portion of the substrate may be exposed to a solution comprising self-assembled nucleic acids to provide a nanostructure that comprises self-assembled nucleic acids on at least a portion of the substrate. Then, the nanostructure may be exposed again to a solution comprising self-assembled nucleic acids. The exposure to the solution comprising self-assembled nucleic acids may be repeated until the desired thickness of the self-assembled nucleic acids on at least a portion of the substrate is achieved.

The defect level, which may also be characterized as defect density, of the features on the substrate may then be determined, the defect level corresponding to defects in the pattern of self-assembled nucleic acids. The defects may be determined using any conventional technique such as optical or e-beam based metrology techniques, and therefore such techniques are not described in detail herein.

The defects in the pattern of self-assembled nucleic acids may be repaired using at least one repair enzyme. The self-assembled nucleic acids on at least a portion of the substrate may be contacted with a solution comprising at least one repair enzyme. By way of non-limiting example, the self-assembled nucleic acids on the at least a portion of the substrate may be exposed to a repair solution comprising at least one repair enzyme by spraying or coating the self-assembled nucleic acids with the repair solution, or by dipping the substrate in the repair solution comprising at least one repair enzyme. The repair enzyme may be selected based at least in part on the identified defects in the pattern of self-assembled nucleic acids. The repair enzyme may be dissolved in an appropriate solvent, such as water, methanol, ethanol, or combinations thereof. The repair solution may include a sufficient concentration of the repair enzyme to repair the defects.

The defects in the self-assembled nucleic acids on the at least a portion of substrate may be repaired by various mechanisms. By way of non-limiting example, the defects may be repaired by at least one of following mechanisms:
(a) a single step mechanism that involves a direct reversal by a single enzyme, such as photolyase enzyme or O-6-methyl-DNA alkyltransferase enzyme;
(b) a single-step or multi-step mechanism that involves base excision, such as using glycosylase enzymes; and
(c) a multi-step mechanism that involves pleiotropic specificities from multiple protein components.

With knowledge of the specific nucleic acids to be used in the self-assembled nucleic acids, the type of repair enzyme may be selected by a person of ordinary skill in the art. Additionally, the repair enzyme may be formulated and configured to selectively repair certain defects in the self-assembled nucleic acids.

In some embodiments, the repair enzyme may include an enzyme in a metallo-β-lactamase superfamily. The repair enzymes in this superfamily usually bind a zinc ion ($Zn^{2+}$), but in a few cases bind an iron ion ($Fe^{2+}$), and catalyze the cleavage of C—N, O=O, C—S, and/or P—O bonds. These repair enzymes repair a defect that involves two divalent metal ion binding sites. Non-limiting example of such repair enzymes may include β-lactamase, oxidoreductase (rubredoxin/oxygen, ROO), glyoxalase IL, or artemis/DNA nuclease.

In some embodiments, the repair enzyme may include an enzyme in a haloacid dehalogenase superfamily. The repair enzymes in this superfamily catalyze the cleavage and formation of C—Cl, C—P, and/or P—O bonds. These repair enzymes repair a defect that involves aspartate nucleophile and a general base. Non-limiting example of such repair enzymes may include haloacid dehalogenase, phosphonatase, $Ca^{2+}$-ATpase, or DNA 3'-phosphatase.

In some embodiments, the repair enzyme may include an enzyme in an Fe (II)/α-ketoglutarate-dependent dioxygenase superfamily. The repair enzymes in this superfamily catalyze the cleavage of C—S and C—N bonds, or formation of C—N, C—O, and C—S heterocycle structure. These repair enzymes repair a defect that involves a single divalent metal ion binding site. Non-limiting example of such repair enzymes may include clavimate synthase, isopenicillin synthase, taurine dioxygenase, or AlkB.

Accordingly, a method of forming a nanostructure comprises forming a pattern of self-assembled nucleic acids on at least a portion of a substrate. The method further comprises exposing the pattern of self-assembled nucleic acids on the at least a portion of the substrate to at least one repair enzyme to repair defects in the self-assembled nucleic acids.

The repairing of defects in the self-assembled nucleic acids on at least a portion of a substrate may be repeated until a desired, reduced threshold level of the defect density is achieved. The defects may be repaired by repeatedly exposing the self-assembled nucleic acids on the substrate to the repair solution. By way of example only, the repair solution may be contacted with the self-assembled nucleic acids between one time and ten times. As the concentration of repair enzyme in a repair solution decreases, a freshly made solution of the repair enzyme having a higher concentration may be employed in substitution for the initial repair solution.

Accordingly, a method of forming a nanostructure comprises forming self-assembled nucleic acids on at least a portion of a substrate, wherein the self-assembled nucleic acids exhibits an initial defect density. The method further comprises contacting the self-assembled nucleic acids on the at least a portion of a substrate with a solution comprising at least one repair enzyme to repair defects in the self-assembled nucleic acids. The method further comprises repeating the repair of defects in the self-assembled nucleic acids until a desired, reduced threshold level of defect density is achieved.

In some embodiments, the defect in the self-assembled nucleic acids on at least a portion of a substrate may be repaired using more than one repair enzyme. In such embodiments, the self-assembled nucleic acid on the at least a portion of a substrate may be exposed to repair solutions including different repair enzymes simultaneously or consecutively to lower the defect density in the self-assembled nucleic acids on the at least a portion of a substrate.

Accordingly, a method of decreasing a defect density in self-assembled nucleic acids on at least a portion of a substrate comprises repairing defects in self-assembled nucleic acids on at least a portion of a substrate by exposure to at least one repair enzyme.

Once the threshold level of the defect density is achieved, the resulting pattern of the self-assembled nucleic acids may be transferred to the substrate. The self-assembled nucleic acids may function as nano-scale templates or masks having operative dimensions of less than about 50 nm to transfer the desired pattern to the substrate.

Figure 3A:
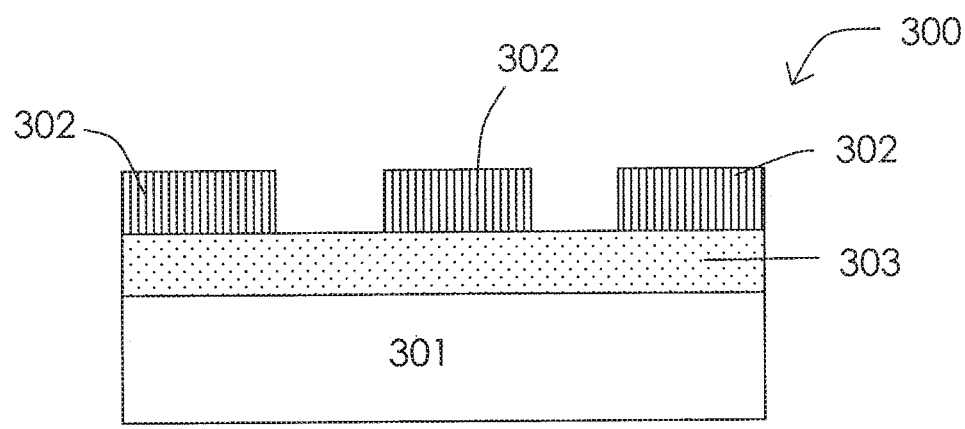
FIGS. 3A-3C are cross-sectional views of various stages of using self-assembled nucleic acids as nano-scale templates or masks to transfer the desired pattern to the substrate, according to one embodiment of the present disclosure.
Figure 3B:
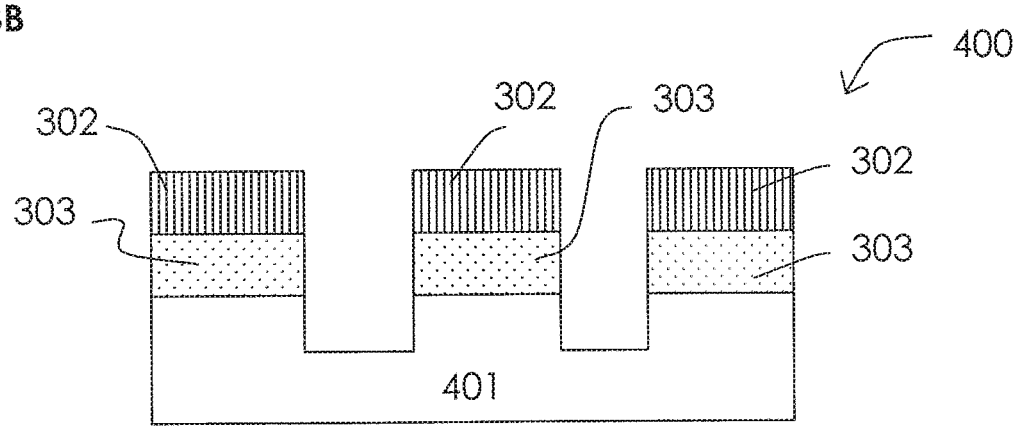
Figure 3C:
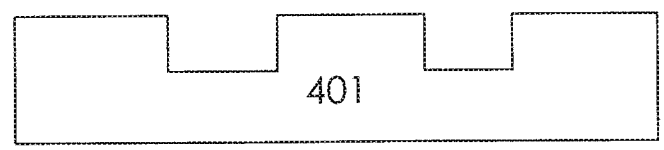

FIGS. 3A-3C show various stages for a method of using the self-assembled nucleic acids as nano-scale templates or masks to transfer the desired pattern to the substrate.

FIG. 3A shows a semiconductor structure 300 that includes a substrate 301, a hardmask material 303 overlying the substrate 301, and a pattern of self-assembled nucleic acids 302 over the hardmask material 303. In FIG. 3B, the pattern of self-assembled nucleic acids 302 is transferred to the hardmask material 303, thus the pattern of self-assembled nucleic acids 302 may function as a nano-scale template. At least a portion of the substrate 301 may be selectively removed using the self-assembled nucleic acids 302 as the template/mask to protect at least a portion of the substrate 301 from an etchant (such term being non-limiting, and encompassing liquid and gaseous fluid compositions suitable to remove substrate material exposed through apertures in the template) to provide a semiconductor structure 400 that includes a modified substrate 401 and the overlying mask comprising the pattern of self-assembled nucleic acids 302 and the hardmask material 303. Then, as shown in FIG. 3C, the self-assembled nucleic acids 302 and the hardmask material 303 may be removed. By way of example only, the self-assembled nucleic acids 302 may be removed by a heat treatment at a temperature of from about 90° C. to about 200° C., or by an acidic solution.

Accordingly, a method of forming a nanostructure comprises forming a mask comprising a pattern of self-assembled nucleic acids over at least a portion of substrate surface, and removing at least a portion of the substrate exposed through the pattern of the mask.

The modified substrate 401 may be further processed for the fabrication of components on the substrate, such as by way of non-limiting example, silicon nanowires, gold nanoparticles, semiconductive quantum dots, or fluorescent quantum dots.

Accordingly, a method of forming a nanostructure comprises forming a mask comprising a pattern of self-assembled nucleic acids over at least a portion of a substrate surface. The method further comprises forming a nanocomponent on at least a portion of the substrate exposed through the pattern in the mask. The nanocomponent comprises a material selected from the group consisting of nanowires, gold nanoparticles, semiconductive quantum dots, and fluorescent quantum dots.

In some embodiments, the self-assembled nucleic acids may be used to form features on the substrate having dimensions of less than about 50 nm and exhibiting a low defect density. By way of example only, the features on the substrate may have dimensions of less than about 40 nm, less than about 30 nm, less than about 20 nm, or less than about 10 nm. The nanostructure comprising self-assembled nucleic acids may be subjected to further processing for fabrication of the desired devices. In some embodiments, the self-assembled nucleic acids may be removed during further processing acts.

Accordingly, a semiconductor structure comprises a pattern of self-assembled nucleic acids defining a template having at least one aperture therethrough, the at least one aperture comprising at least one dimension of less than about 50 nm.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A method of forming a structure, comprising:
contacting a mask of self-assembled nucleic acids with at least one repair enzyme to repair defects in the mask of self-assembled nucleic acids; and
forming a nanocomponent on a material exposed through the mask.

2. The method of claim 1, wherein contacting a mask of self-assembled nucleic acids with at least one repair enzyme comprises contacting the mask comprising self-assembled deoxyribonucleic acids with the at least one repair enzyme.

3. The method of claim 1, wherein contacting a mask of self-assembled nucleic acids with at least one repair enzyme comprises contacting the mask comprising self-assembled ribonucleic acids with the at least one repair enzyme.

4. The method of claim 1, wherein contacting a mask of self-assembled nucleic acids with at least one repair enzyme comprises contacting the mask of self-assembled nucleic acids exhibiting an initial defect density with the at least one repair enzyme.

5. The method of claim 1, wherein forming a nanocomponent on a material exposed through the mask comprises forming the nanocomponent comprising at least one dimension of less than about 50 nm on the material.

6. The method of claim 1, wherein forming a nanocomponent on a material exposed through the mask comprises forming the nanocomponent comprising a lower defect level than a defect level in the mask of self-assembled nucleic acids.

7. The method of claim 1, wherein forming a nanocomponent on a material exposed through the mask comprises forming nanowires, gold nanoparticles, semiconductive quantum dots, or fluorescent quantum dots on the material.

8. The method of claim 1, further comprising removing the mask of self-assembled nucleic acids.

9. A method of forming a structure, comprising:
contacting a pattern of self-assembled nucleic acids with at least one repair enzyme to repair defects in the pattern;
repeating the repair of defects until a reduced threshold level of defect density is achieved; and
transferring the repaired pattern to an underlying material.

10. The method of claim 9, wherein contacting a pattern of self-assembled nucleic acids with at least one repair enzyme to repair defects in the pattern comprises excising at least one base from the pattern of self-assembled nucleic acids.

11. The method of claim 9, wherein contacting a pattern of self-assembled nucleic acids with at least one repair enzyme to repair defects in the pattern comprises repairing at least one metal ion binding site in the pattern of self-assembled nucleic acids.

12. The method of claim 9, wherein transferring the repaired pattern to an underlying material comprises transferring the repaired pattern to a hardmask material.

13. The method of claim 9, wherein transferring the repaired pattern to an underlying material comprises transferring the repaired pattern to a polymer material.

14. The method of claim 9, wherein transferring the repaired pattern to an underlying material comprises transferring the repaired pattern to a metal material.

15. A method of forming a structure, comprising:
forming a self-assembled nucleic acid pattern on a material, the self-assembled nucleic acid pattern comprising defects;
contacting the self-assembled nucleic acid pattern with at least one repair enzyme to repair at least one defect of the defects;
repeating the repair of the defects until a reduced threshold level of defect density is achieved; and
transferring the repaired self-assembled nucleic acid pattern to the material.

16. The method of claim 15, wherein forming a self-assembled nucleic acid pattern on a material comprises forming the self-assembled nucleic acid pattern substantially completely over a surface of the material.

17. The method of claim 16, further comprising removing a portion of the self-assembled nucleic acid pattern from the surface of the material.

18. The method of claim 15, wherein forming a self-assembled nucleic acid pattern on a material comprises forming the self-assembled nucleic acid pattern on at least a portion of the material.

19. The method of claim 15, wherein forming a self-assembled nucleic acid pattern on a material comprises covalently bonding self-assembled nucleic acids of the self-assembled nucleic acid pattern to the material.

20. The method of claim 15, wherein forming a self-assembled nucleic acid pattern on a material comprises ionically bonding self-assembled nucleic acids of the self-assembled nucleic acid pattern to the material.

21. The method of claim 15, wherein transferring the repaired self-assembled nucleic acid pattern to the material comprises forming at least one feature in the material, the at least one feature comprising at least one dimension of less than about 50 nm.

* * * * *

SEQUENCE LISTING

```
<160> NUMBER OF SEQ ID NOS: 8

<210> SEQ ID NO 1
<211> LENGTH: 8
<212> TYPE: DNA
<213> ORGANISM: Artificial Sequence
<220> FEATURE:
<223> OTHER INFORMATION: synthesized

<400> SEQUENCE: 1 ctgacgcg                                                             8

<210> SEQ ID NO 2
<211> LENGTH: 8
<212> TYPE: DNA
<213> ORGANISM: Artificial Sequence
<220> FEATURE:
<223> OTHER INFORMATION: synthesized

<400> SEQUENCE: 2
```

```
ccaatcag                                                                    8

<210> SEQ ID NO 3
<211> LENGTH: 8
<212> TYPE: DNA
<213> ORGANISM: Artificial Sequence
<220> FEATURE:
<223> OTHER INFORMATION: synthesized

<400> SEQUENCE: 3 cgcgttgg                                                                    8

<210> SEQ ID NO 4
<211> LENGTH: 30
<212> TYPE: DNA
<213> ORGANISM: Artificial Sequence
<220> FEATURE:
<223> OTHER INFORMATION: synthesized

<400> SEQUENCE: 4
accaagtcag ccgaacgcgc acgctgtggg                                           30

<210> SEQ ID NO 5
<211> LENGTH: 10
<212> TYPE: DNA
<213> ORGANISM: Artificial Sequence
<220> FEATURE:
<223> OTHER INFORMATION: synthesized

<400> SEQUENCE: 5
cccacttggt                                                                 10

<210> SEQ ID NO 6
<211> LENGTH: 10
<212> TYPE: DNA
<213> ORGANISM: Artificial Sequence
<220> FEATURE:
<223> OTHER INFORMATION: synthesized

<400> SEQUENCE: 6
gcgcgagcgt                                                                 10

<210> SEQ ID NO 7
<211> LENGTH: 10
<212> TYPE: DNA
<213> ORGANISM: Artificial Sequence
<220> FEATURE:
<223> OTHER INFORMATION: synthesized

<400> SEQUENCE: 7
ctgacttcgg                                                                 10

<210> SEQ ID NO 8
<211> LENGTH: 32
<212> TYPE: DNA
<213> ORGANISM: Artificial Sequence
<220> FEATURE:
<223> OTHER INFORMATION: synthesized

<400> SEQUENCE: 8
ccaatcagtt ttctgacgcg ttttcgcgtt gg                                        32
```